(12) United States Patent
Kim et al.

(10) Patent No.: US 12,334,126 B2
(45) Date of Patent: Jun. 17, 2025

(54) MAGNETIC MEMORY USING SPIN CURRENT, OPERATING METHOD THEREOF, AND ELECTRONIC APPARATUS INCLUDING MAGNETIC MEMORY

(71) Applicants: Samsung Electronics Co., Ltd., Suwon-si (KR); SEOUL NATIONAL UNIVERSITY R&DB FOUNDATION, Seoul (KR)

(72) Inventors: Kwangseok Kim, Seoul (KR); Je-Geun Park, Seoul (KR); Kaixuan Zhang, Seoul (KR); Jingyuan Cui, Seoul (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 218 days.

(21) Appl. No.: 17/964,373

(22) Filed: Oct. 12, 2022

(65) Prior Publication Data

US 2023/0352072 A1    Nov. 2, 2023

(30) Foreign Application Priority Data

Apr. 29, 2022    (KR) .................. 10-2022-0053811

(51) Int. Cl.
  *G11C 11/00*    (2006.01)
  *G11C 11/16*    (2006.01)
  (Continued)

(52) U.S. Cl.
  CPC ............ *G11C 11/18* (2013.01); *G11C 11/161* (2013.01); *G11C 11/1675* (2013.01);
  (Continued)

(58) Field of Classification Search
  CPC ...................................................... G11C 11/18
  (Continued)

(56) References Cited

U.S. PATENT DOCUMENTS

2012/0281465 A1\* 11/2012 Agan ................ G11C 11/1675
                                                              365/158
2014/0353662 A1\* 12/2014 Shukh ................... H10B 63/30
                                                              257/43

(Continued)

FOREIGN PATENT DOCUMENTS

KR        10-2251067 B1    12/2020
KR        10-2310181 B1    4/2021
KR     10-2022-0013927 A   2/2022

*Primary Examiner* — Hoai V Ho
(74) *Attorney, Agent, or Firm* — HARNESS, DICKEY & PIERCE, P.L.C.

(57) ABSTRACT

Provided are a magnetic memory using a spin current, an operating method thereof, and/or an electronic apparatus including the magnetic memory. The magnetic memory includes, first and second wirings spaced apart from each other and intersecting each other, and a data storage layer between the first and second wirings. The data storage layer includes a pinned layer with a fixed magnetic moment, a free layer spaced apart from the pinned layer and not having a fixed magnetic moment, and an insulating tunnel barrier layer provided between the pinned layer and the free layer. Among the first and second wirings, the wiring contacting the free layer includes a conductive wiring having no spin Hall effect, and the free layer includes a two-dimensional material which at room temperature has a spin Hall effect, magnetic properties, and metal properties. The two-dimensional material includes a two-dimensional van der Waals material.

21 Claims, 8 Drawing Sheets

(51) Int. Cl.
  *G11C 11/18*   (2006.01)
  *H10B 61/00*   (2023.01)
  *H10N 50/10*   (2023.01)
  *H10N 50/85*   (2023.01)
  *H10N 52/00*   (2023.01)
  *H10N 52/80*   (2023.01)
(52) U.S. Cl.
  CPC .............. *H10B 61/00* (2023.02); *H10N 50/10* (2023.02); *H10N 50/85* (2023.02); *H10N 52/101* (2023.02); *H10N 52/80* (2023.02)
(58) Field of Classification Search
  USPC ......................................................... 365/170
  See application file for complete search history.

(56)            References Cited

U.S. PATENT DOCUMENTS

| | | |
|---|---|---|
| 2016/0232959 A1 | 8/2016 | Lee et al. |
| 2018/0122825 A1* | 5/2018 | Lupino ................. H10B 63/20 |
| 2020/0082861 A1 | 3/2020 | Sasaki et al. |
| 2021/0098041 A1* | 4/2021 | Kim ................... G06F 12/0238 |
| 2021/0148998 A1 | 5/2021 | Wang et al. |
| 2022/0029090 A1 | 1/2022 | Cho et al. |
| 2022/0123204 A1* | 4/2022 | Choi ....................... H10N 50/80 |
| 2023/0133622 A1* | 5/2023 | Song .................. G11C 11/1675 |
| | | 365/148 |

* cited by examiner

MAGNETIC MEMORY USING SPIN CURRENT, OPERATING METHOD THEREOF, AND ELECTRONIC APPARATUS INCLUDING MAGNETIC MEMORY

CROSS-REFERENCE TO RELATED APPLICATION

This application is based on and claims priority under 35 U.S.C. § 119 to Korean Patent Application No. 10-2022-0053811, filed on Apr. 29, 2022, in the Korean Intellectual Property Office, the disclosure of which is incorporated by reference herein in its entirety.

BACKGROUND

Various example embodiments relate to a memory device, and more particularly, to a magnetic memory using a spin current, an operating method thereof, and/or an electronic apparatus including the magnetic memory.

A magnetic memory device records or reads information using a tunneling magnetoresistance (TMR) phenomenon.

When the magnetic moment directions of the two magnetic layers included in a magnetic tunnel junction (MTJ) of a magnetic memory device are parallel to each other, the magnetic memory device has low resistance, and when the magnetic moment directions are parallel opposite to each other, the magnetic memory device has higher resistance.

An MTJ includes two magnetic layers, such as a pinned layer, which is also referred to as a fixed layer and may have a fixed direction of the magnetic moment, and a free layer in which the direction of the magnetic moment may be switched.

A magnetic memory device using a spin transfer torque for a writing operation for determining a direction of the free layer is referred to as a spin transfer torque-magnetic random access memory (STT-MRAM), and a magnetic memory device using a spin orbit torque is referred to as a spin orbit torque magnetic random-access memory (SOT-MRAM).

The STT-MRAM is applied to an embedded memory, and performs a read operation and a write operation using a current flowing through the MTJ.

The SOT-MRAM has three terminal structures for switching the free layer with a current flowing in a spin orbit torque (SOT) layer formed below the MTJ.

The SOT-MRAM compared to the STT-MRAM enables fast operation of 1 nanosecond or less (<1 nsec), and the write path and the read path are separated so that a write bias is not directly applied to the tunnel barrier layer of the MTJ, and thus durability may be improved.

SUMMARY

Provided is a magnetic memory device using a spin current, having high-speed switching characteristics and high durability.

Alternatively or additionally, provided is a magnetic memory device using a spin current, capable of increasing an integration degree.

Alternatively or additionally, provided is a magnetic memory device using a spin current, capable of lowering an operating current density.

Alternatively or additionally, provided are a method of manufacturing a magnetic memory device and an operating method of the magnetic memory device.

Alternatively or additionally, provided is an electronic apparatus including a magnetic memory device.

Additional aspects will be set forth in part in the description which follows and, in part, will be apparent from the description, or may be learned by practice of the presented embodiments of the disclosure.

According to some example embodiments, a magnetic memory using a spin current includes a first wiring and a second wiring that are spaced apart from each other, and a data storage layer between the first and second wirings. The data storage layer includes a pinned layer having a fixed magnetic moment and a free layer spaced apart from the pinned layer and having no fixed magnetic moment. Among the first and second wirings, the wiring contacting the free layer is or includes a conductive wiring having no spin Hall effect, and the free layer includes a two-dimensional material having a spin Hall effect, magnetic properties, and metal properties. In some examples, the two-dimensional material may include a two-dimensional van der Waals material. In some examples, the two-dimensional van der Waals material may include one or more of $Fe_{(x)}GeTe_2$ (x is 3 to 5), $CrTe_2$, and $VSe_2$. In some examples, each of the first and second wirings may be provided with a plurality of wirings, and the data storage layer may be provided for each cross area of the plurality of first wirings and the plurality of second wirings. In some examples, the data storage layer may include an MTJ layer in each cross area and may further include an insulating tunnel barrier layer provided between the pinned layer and the free layer. In some examples, the tunnel barrier layer may include one or more of an MgO layer, a boron nitride (BN) layer, or an aluminum oxide layer. In some examples, a material of the pinned layer may be the same as or different from the material of the free layer.

According to some example embodiments, there is provided an operating method of a spin orbit torque-magnetic random access memory (SOT-MRAM), wherein the method includes applying a first operating current to a wiring contacting the free layer of the first and second wirings, a first spin current being generated to the free layer by the first operating current; and applying a second operating current to a wiring not contacting the free layer of the first and second wirings, a second spin current being generated to the free layer by the second operating current. In some examples, the second operating current may be less than the first operating current. In some examples, the first and second operating currents may be or may correspond to either or both of a write current or an erasure current.

According to some example embodiments, there is provided an operating method of a magnetic memory including a magnetic tunnel junction (MTJ) including a pinned layer and a free layer, the method comprising: lowering a coercive force of the free layer by using a first spin current; and switching a magnetic moment of the free layer in which the coercive force is lowered by using a second spin current. In some examples, the first and second spin currents may be or may correspond to currents for data recording and/or current for data erasure.

In some examples, the process of lowering the coercive force of the free layer may include applying the first operating current to the wiring contacting the free layer.

In some examples, the process of switching the magnetic moment of the free layer includes a process of applying the second operating current to the wiring contacting the pinned layer. In some examples, the free layer may include a two-dimensional van der Waals material having a spin Hall effect at room temperature and magnetic properties and metallic properties. In some examples, the wiring contacting the free layer may include a metal wiring having no spin Hall effect.

According to some example embodiments, there is provided an electronic apparatus including a memory, wherein the memory includes the magnetic memory according to various example embodiments described above.

According to some example embodiments, a magnetic memory includes a first wiring extending in a first direction, a second wiring extending in a second direction over the first wiring, and a data storage layer at an intersection between the first wiring and the second wiring and contacting the first and second wirings. The data storage layer comprises a pinned layer having a fixed magnetic moment, a free layer apart from the pinned layer and configured to rotate the magnetic moment, and an insulating tunnel barrier layer between the pinned layer and the free layer. One of the first and second wirings contacts the free layer and includes a conductive wiring that does not have a spin Hall effect, and the free layer comprises a two-dimensional material having a spin Hall effect, magnetic properties, and metallic properties. The first direction may be orthogonal with the second direction. The first wiring may correspond to a bit line of the magnetic memory, and the second wiring corresponds to a word line of the magnetic memory. A spin orbit torque-magnetic random access memory (SOT-MRAM) may comprise a plurality of the magnetic memories, wherein the plurality of magnetic memories are arranged in a cross-point lattice.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
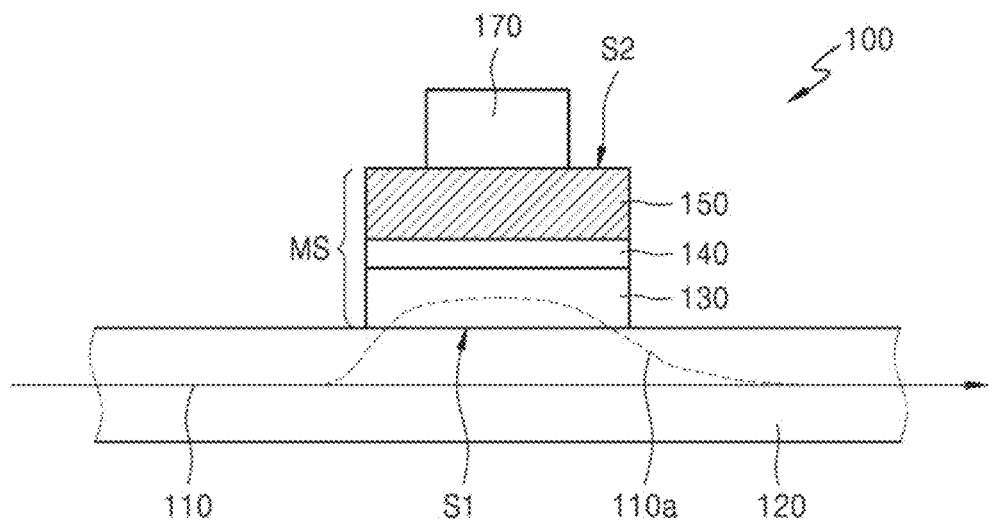
FIG. 1 is a cross-sectional view illustrating a unit cell of a magnetic memory device using a spin current, according to some example embodiments, which is a unit cell of a spin orbit torque magnetic random-access memory (SOT-MRAM)

Reference will now be made in detail to certain example embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Although numerical terms such as "first," "second," "third," etc., may be used herein to describe various elements, components, regions, layers, and/or sections, these numerical terms are only used to distinguish one element, component, region, layer, or section, from another region, layer, or section; and the elements, components, regions, layers, and/or sections, and should not be otherwise limited by these numerical terms. Thus, a first element, component, region, layer, or section, discussed below may be termed a second element, component, region, layer, or section, without departing from the scope of this disclosure.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around stated numerical values or shapes.

Hereinafter, a magnetic memory using a spin current according to an example embodiment, an operating method thereof, and an electronic apparatus including the magnetic memory device will be described in detail with reference to the accompanying drawings. In the following description, the thickness of the layers or regions shown in the drawings may be somewhat exaggerated for clarity of the specification. In addition, various embodiments described below are merely examples and various modifications are possible from embodiments. Further, in the layer structure described below, the expressions referred to as "upper portion" or "on" may be referred to an being in contact directly, as well as being one above another in non-contact. In the following description, like reference numerals refer to like elements in each drawing.

First, a magnetic memory using a spin current according to some example embodiments will be described.

Figure 2:
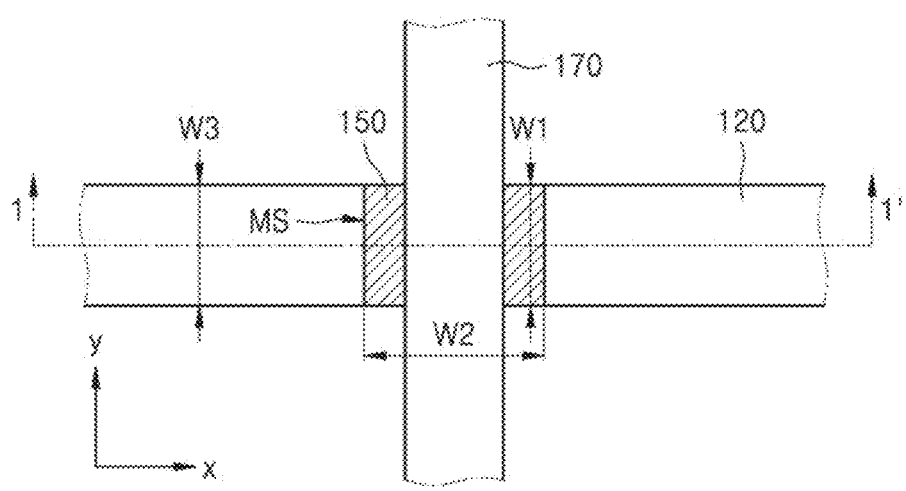
FIG. 2 is a plan view of a unit cell of the SOT-MRAM of FIG. 1.

FIG. 1 is a cross-sectional view illustrating a magnetic memory device using a spin current, according to some example embodiments, which is a unit cell of a spin orbit torque magnetic random access memory (SOT-MRAM), and FIG. 2 is a plan view thereof. FIG. 1 is a cross-sectional view taken along the line 1-1' of FIG. 2.

Referring to FIGS. 1 and 2, a unit cell 100 of the SOT-MRAM may include a first wiring 120, a second wiring 170, and a data storage layer MS. In some examples, the unit cell 100 may be formed to further include other members or components. The first wiring 120 and the second wiring 170 are spaced apart from each other. The first wiring 120 and the second wiring 170 may be arranged to cross each other (e.g. to cross each other in a perpendicular manner), and the first and second wirings 120 and 170 may cross each other vertically. One of the first and second wirings 120 and 170 may be or may correspond to a bit line or include a bit line, and the other may be or may correspond to a word line or include a word line. In some examples, the first wiring 120 may be a bit line, e.g. a column and the second wiring 170 may be a word line, e.g. a row. In some examples, the first wiring 120 may be a word line and the second wiring 170 may be a bit line. The first and/or second wirings 120 and 170 may be or include conductive wirings used in a semiconductor device and/or an electronic apparatus, for example, may be metal wirings having no spin Hall effect or substantially no spin Hall effect or include such metal wirings. In some examples, the first and/or second wirings 120 and 170 may be copper (Cu) wirings or may include copper wirings, but are not limited to the copper wirings.

The data storage layer MS is formed or arranged between the first wiring 120 and the second wiring 170. The first surface S1 of the data storage layer MS is connected to (or directly connected to) one of the first and second wirings 120 and 170, and the second surface S2 is connected to (or directly connected to) the other of the first and second wirings 120 and 170. Here, the term "connection" may include a contact or a contact state. In some examples, the first surface S1 may be the bottom surface of the data storage layer MS and may be in direct contact with the first wiring 120. In some examples, the second surface S2 may be the top surface of the data storage layer MS and may be in direct contact with the first wiring 170. The "bottom surface" and the "top surface" may be referred to differently depending on the viewpoint of viewing the unit cell 100. For example, depending on the viewpoint, the "bottom surface" may be an upper surface or a side surface, and the "top surface" may be a bottom surface or a side surface.

The first and second surfaces S1 and S2 may be spaced apart from each other in a direction perpendicular to or substantially perpendicular to the first wiring 120 and/or second wiring 170, and may face each other. Alternatively or additionally, the first and second surfaces S1 and S2 may be parallel or substantially parallel to each other, but are not limited thereto. Alternatively or additionally, the first surface S1 and/or second surface S2 may be parallel or substantially parallel to the first wiring 120 and/or second wiring 170.

The entire data storage layer MS may be provided on the first wiring 120. For example, the entire data storage layer MS may be arranged on the top surface of the first wiring 120, but is not limited thereto.

In some examples, the data storage layer MS has a first width W1 in a direction (e.g. a Y-axis direction) perpendicular to the longitudinal direction (e.g. an X-axis direction) of the first wiring 120, and may have a second width W2 in the longitudinal direction of the first wiring 120. The first and second widths W1 and W2 may be the same as or different from each other. The first wiring 120 may have a third width W3 in a direction perpendicular to the longitudinal direction. The first width W1 of the data storage layer MS and the third width W3 of the first wiring 120 may be the same or may be different from each other. In some examples, the first width W1 of the data storage layer MS may be less than the third width W3 of the first wiring 120.

In some examples, the data storage layer MS may be or may include or correspond to a magnetic tunnel junction (MTJ) layer.

The data storage layer MS may include a first layer 130, a second layer 140, and a third layer 150 sequentially stacked on the first wiring 120 in the direction of the second wiring 170. In some examples, the sizes of the first to third layers 130, 140, and 150 may be the same. The thicknesses of the first to third layers 130, 140, and 150 may be different from each other, but some of the layers may be the same. In some examples, the first layer 130 and the third layer 150 may have the same thickness.

The bottom surface of the first layer 130 directly contacting the first wiring 120 may correspond to the first surface S1 of the data storage layer MS. The top surface of the third layer 150 directly contacting the second wiring 170 may correspond to the second surface S2 of the data storage layer MS.

The first layer 130 and/or the third layer 150 may be a monolayer, or have a layer structure consisting of or having a plurality of monolayers, that is, a multilayer structure. At least some materials of the first and third layers 130 and 150 may be different from the material of the second layer 140. The first and/or third layers 130 and 150 may include a material layer exhibiting a spin Hall effect, magnetic properties, and metal properties. In some examples, the first and/or third layers 130 and 150 may include a 2D material layer exhibiting ferromagnetic properties and metal properties at room temperature while having a spin Hall effect. As an example of the metal characteristics, the resistance of the 2D material layer may be lower than 500 μΩcm.

In some examples, such a 2D material layer may be or may include a 2D van der Waals (hereinbelow, referred to as 2 dvW) material layer or may include a 2 dvW material layer. In some examples, the 2 dvW material layer may include any one of or at least one of $Fe_{(x)}GeTe_2$, $CrTe_2$, and $VSe_2$. In some examples, "x" of $Fe_{(x)}GeTe_2$ may be 3 to 5, e.g., 3, 4, or 5.

In some examples, the 2D material layer used as the material of the first layer 130 and/or the third layer 150 may include a material layer that a ratio where the charge current is changed to a spin current, e.g., a spin Hall angle (SHA) is a first value. In some examples, the first value may be greater than 0.3 and less than 1.0. The first value of 0.3 indicates that 30% of the charge current is changed to the spin current.

In some examples, one of the first layer 130 and the third layer 150 may be or correspond to a pinned layer in which a magnetic moment is fixed or substantially fixed in a first direction, and the other may be or correspond to a free layer in which the magnetic moment may be rotated or switched in the first or second direction by an external action. The magnetic moment may be represented as a magnetic polarization. The second direction may be opposite to (antiparallel with) the first direction. The first and second directions may be perpendicular to the first and/or second wirings 120 and 170. In some examples, the action given from the outside may be a magnetic field given from the outside of the data storage layer MS or a current flowing through the other of the first layer 130 and the third layer 150.

When the magnetic moment direction of the free layer is aligned in parallel with the magnetic moment direction of the pinned layer, the data storage layer MS becomes a first state having a low electrical resistance. In contrast, when the magnetic moment direction of the free layer is opposite to that of the pinned layer, the data storage layer MS becomes a second state having a high electrical resistance, with a resistance more than that of the low resistance state. One of the first and second states may be considered to be written with data "1" and the other may be considered to be written with data "0".

In some examples, the first and/or third layers 130 and 150 include a 2D material layer as described above, and a layer used as the free layer of the first and third layers 130 and 150 may be formed as a monolayer of 2D material. In this case, the operating current (e.g., the write operation current) of the unit cell 100 may be further lowered.

The second layer 140 is or includes a tunnel barrier layer. In some examples, the second layer 140 may include a material layer having no spin Hall effect or substantially no spin Hall effect. In some examples, the second layer 140 may be an insulating layer or may include such an insulating layer. In some examples, the insulating layer may include, but is not limited to, one or more of a magnesium oxide (e.g., MgO) layer, a boron nitride (BN) layer, or an aluminum oxide layer.

In FIG. 2, a planar shape of the data storage layer MS is formed to have a rectangular shape, but is not limited thereto. In some examples, the data storage layer MS may be formed to have a circular planar shape or an oval planar shape or a polygonal planar shape.

In some examples, a separate thin conductive layer may be further provided between one or both of the first and second wirings 120 and 170 and the data storage layer MS. In this case, the first and/or second wirings 120 and 170 may not be in direct contact with the data storage layer MS. The conductive layer may include a metal layer.

As illustrated in FIG. 1, as an operating voltage is applied to the unit cell 100, the operating current 110 flows in the first wiring 120, and the first layer 130 contacting the first wiring 120 has metal characteristics, and thus the operating current 110 also flows in the first layer 130 as indicated by a dotted line 110a. Accordingly, a spin current may be generated in the first layer 130 by a spin Hall effect. When a separate conductive layer is provided between one or both of the first and second wirings 120 and 170 and the data storage layer MS, the conductive layer may have a thickness that does not interfere or that does not significantly interfere with the operation current 110 flowing through the first layer 130.

Figure 3:
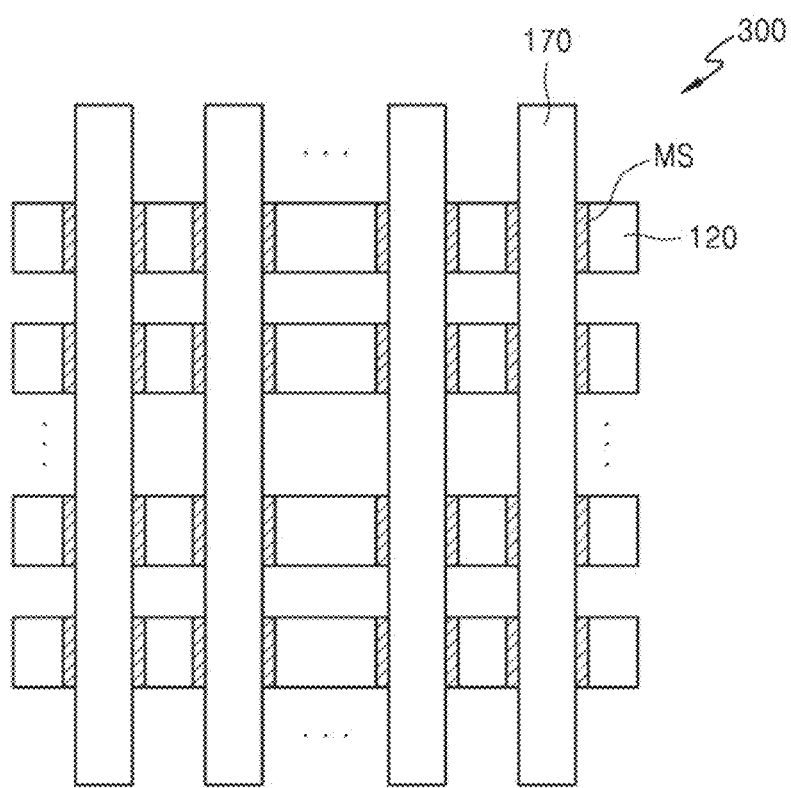
FIG. 3 shows an MTJ cell array of a SOT-MRAM in which the MTJ cell array consists of the unit cells of the SOT-MRAM of FIG. 1.

FIG. 3 illustrates a SOT-MRAM array 300 including unit cells 100 of the SOT-MRAM shown in FIGS. 1 and 2.

Referring to FIG. 3, the array 300 includes a plurality of first wirings 120 arranged parallel to each other and a plurality of second wirings 170 arranged parallel to each other. The plurality of first wirings 120 may be arranged to have a dynamically determined, or predetermined distance from each other. The plurality of second wirings 170 may be arranged to have a dynamically determined, or predetermined distance from each other. The first wirings 120 and the second wirings 170 are arranged to vertically intersect each other. A data storage layer MS is provided at each intersection of the first wiring 120 and the second wiring 170, that is, at each crossing area. The array 300 may have a cross-point architecture; however, example embodiments are not limited thereto.

A plurality of data storage layers MS are arranged on one first wiring 120, and as described above, the first wiring 120 is not formed of a material of a SOT layer having higher electrical resistance than a general metal layer such as a bit line of a conventional SOT-MRAM. In some examples, the second wiring 170 may be arranged in a direction that is not perpendicular to the first wiring 120.

The first wiring 120 is or includes a metal wiring used as an electrical wiring in a semiconductor device or a general electronic apparatus, and has a much lower electrical resistance than a SOT layer of a conventional SOT-MRAM. In some examples, the operating current density of the SOT-MRAM according to some example embodiments is about 1 MA per square centimeter, which is about 1/10 to 1/100 of existing operating current density of the SOT-MRAM.

Since the electrical resistance of the first wiring 120 is low, the number of data storage layers MS that may be aligned (or formed) on one first wiring 120 may be greater than of existing SOT-MRAM.

As a result, in the case of the SOT-MRAM according to some example embodiments, the number of unit cells that can be driven by one driving circuit may be increased compared to the existing SOT-MRAM. Therefore, an area occupied by the driving circuit in the SOT-MRAM according to some example embodiments may be smaller than an area occupied by the driving circuit in the existing SOT-MRAM.

For example, when the areas occupied by the driving circuits are the same, the degree of integration of the SOT-MRAM according to some example embodiments may be greater than that of the existing SOT-MRAM.

FIGS. 4A to 4D show experimental results for confirming or determining magnetic properties of a 2 dvW material used as a free layer of the date storage layer MS. In the experiments for obtaining the experimental results of FIGS. 4A to 4D, FGT (e.g., $Fe_3GeTe_2$) was used as the 2 dvW material.

Figure 4A:
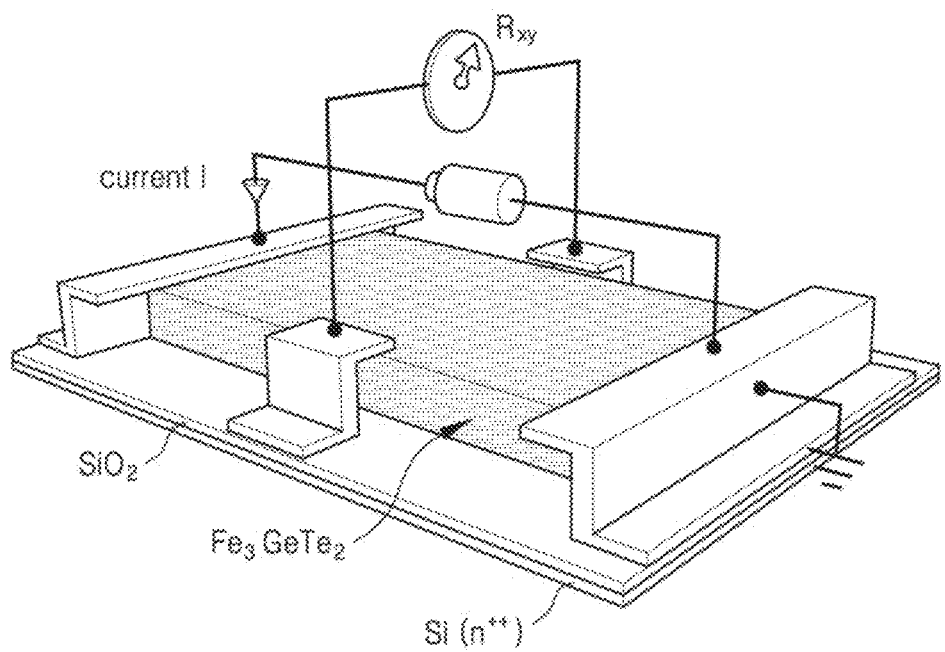
FIGS. 4A to 4D are graphs illustrating simulation results for switching characteristics of a 2D van der Waals material used as a free layer of an MTJ cell of a SOT-MRAM according to some example embodiments.

In the experiment, as shown in FIG. 4A, an FGT layer was formed on a silicon (Si) substrate having an upper surface covered with a $SiO_2$ layer, and then a potential difference was formed between both ends of the formed FGT layer, thereby allowing a current to flow in the FGT layer. At the same time, the resistance of the FGT layer was measured at a point between both ends of the FGT layer in a direction perpendicular to both ends.

Figure 4B:
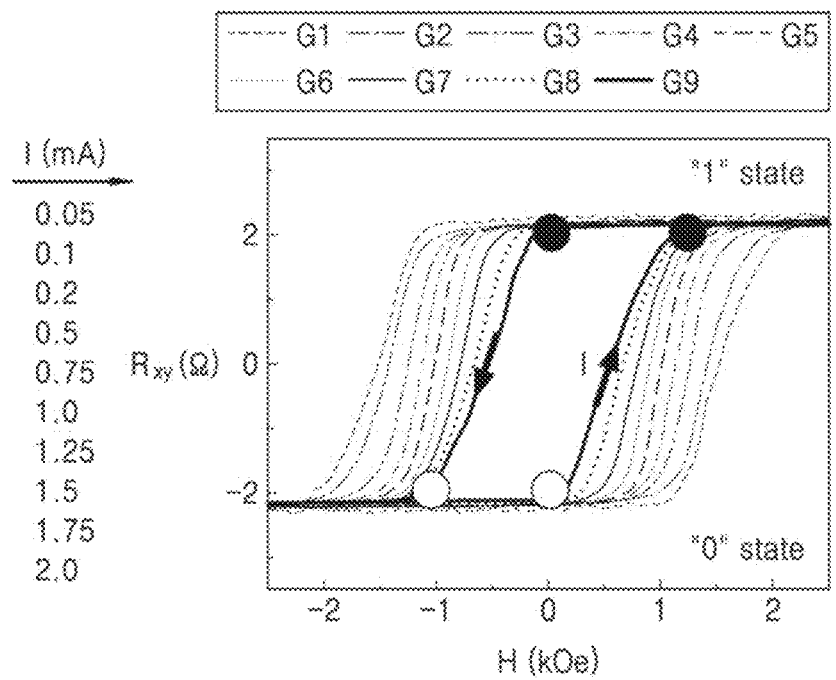

FIG. 46 illustrates a change in the coercive force of the FGT layer according to a current (about 0.05 mA to 2.0 mA) applied to the FGT layer. In FIG. 4B, the horizontal axis represents the strength of the magnetic field and the vertical axis represents the resistance.

In FIG. 48, a first graph G1 indicates when the applied current is 0.05 mA or 0.1 mA. The change in the coercive force of the FGT layer when the applied current is 0.05 mA and the change in the coercive force of the FGT layer when the applied current is 0.1 mA are similar to each other and overlap each other on the graph. Accordingly, the changes in the coercive force of the FGT layer when the applied currents are 0.05 mA and 0.1 mA, respectively, are represented by one first graph G1. A second graph to a ninth graph G2-G9 represent respective changes in the coercive force when the applied currents are 0.2 mA, 0.5 mA, 0.75 mA, 1.0 mA, 1.25 mA, 1.5 mA, 1.75 mA and 2.0 mA.

FIG. 4B shows that the FGT layer is a ferromagnetic layer having magnetic hysteresis characteristics. In addition, as the magnitude of the applied current increases, the width of a graph representing the magnetic hysteresis characteristic decreases, which suggests that or is consistent with the coercive force Hc of the FGT layer decreases as the magnitude of the current applied to the FGT layer increases. These results show that as the current applied to the FGT layer having a spin Hall effect increases the spin Hall effect of the FGT layer increases (spin current increases), and thus the coercive force of the FGT layer decreases. For example, as the current applied to the FGT layer increases, the spin current in the FGT layer increases, and thus the strength of the magnetic field required for switching the magnetic moment of the FGT layer may decrease. The current applied to the FGT layer may be regarded as a write current in an operation of recording information in the data storage layer MS.

Figure 4C:
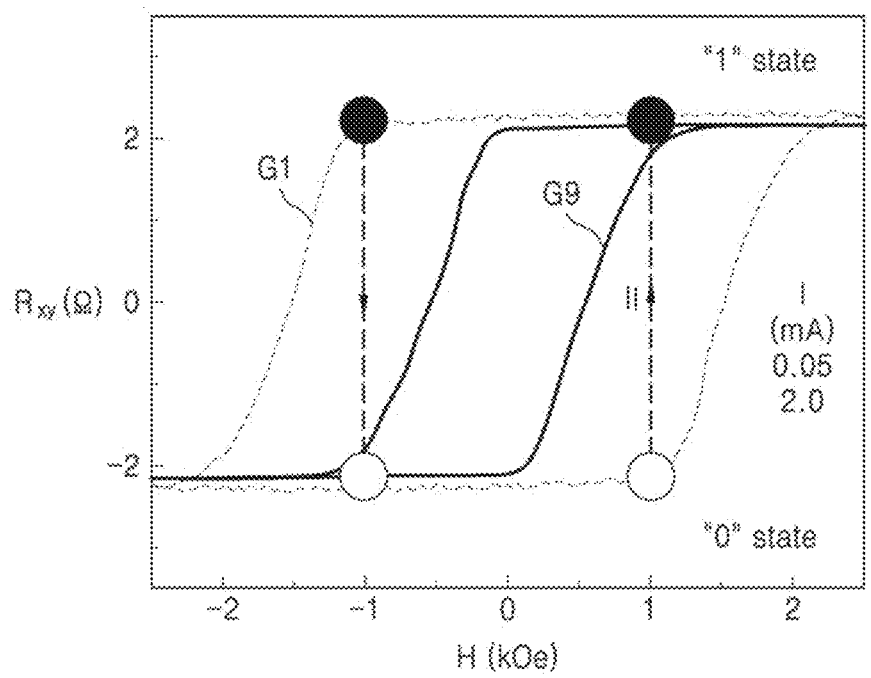

FIG. 4C illustrates only the separate magnetic hysteresis characteristics of the FGT layer when a large or the maximum current (2.0 mA) and a small or the minimum current (0.05 mA) are applied in FIG. 4B.

Referring to FIG. 4C, it may be seen that the width of the magnetic hysteresis characteristic graph when a minimum current is applied to the FGT layer is much smaller than the width of the magnetic hysteresis characteristic graph when the maximum current is applied thereto.

Figure 4D:
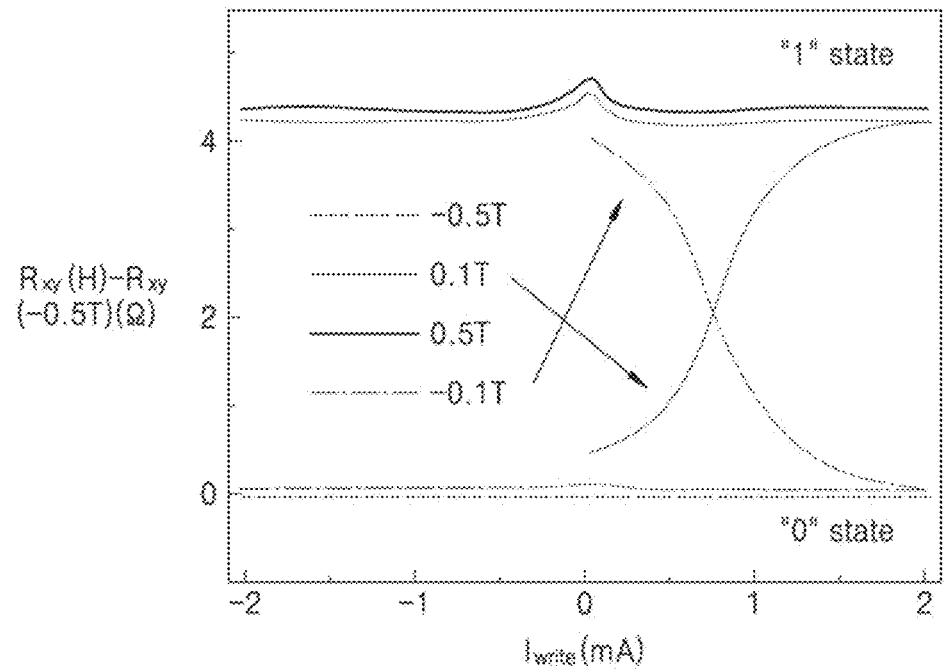

FIG. 4D illustrates that switching occurs between the "1" state and the "0" state even in a small coercive force as a write operation current (1write) applied to the FGT layer increases.

Figure 5:
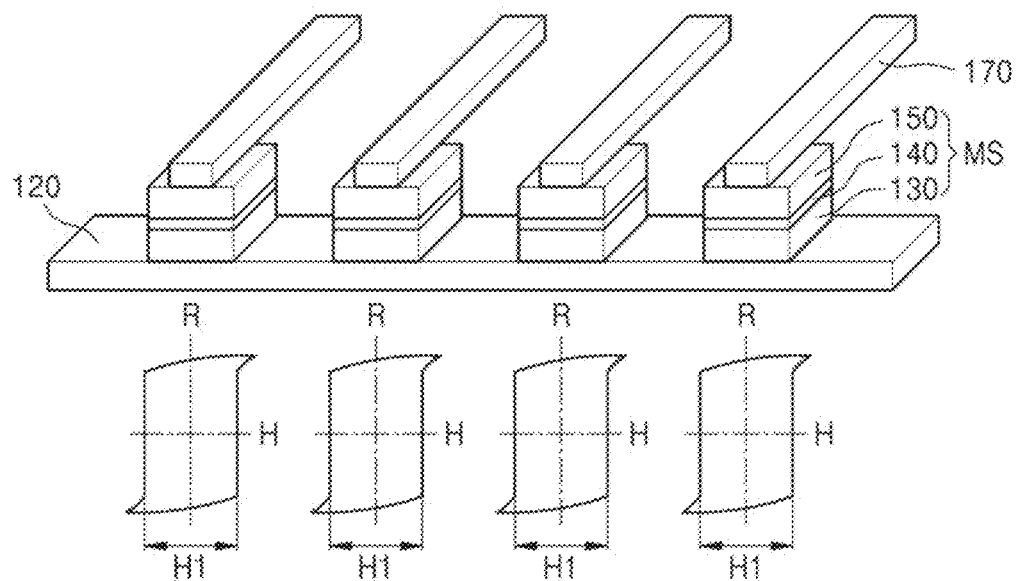
FIGS. 5 to 7 are perspective views illustrating stepwise operation processes of the SOT-MRAM according to some example embodiments.
Figure 6:
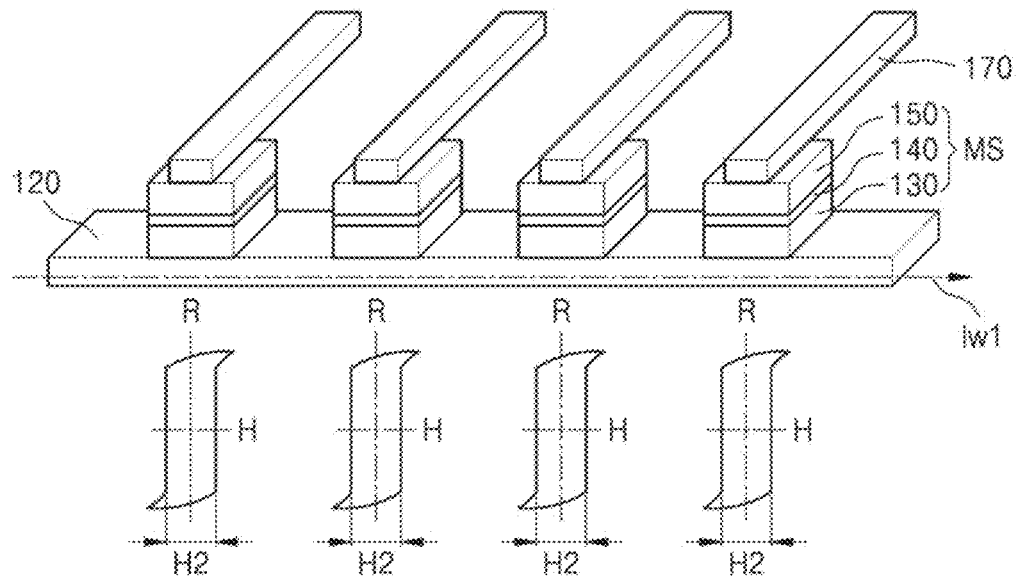
Figure 7:
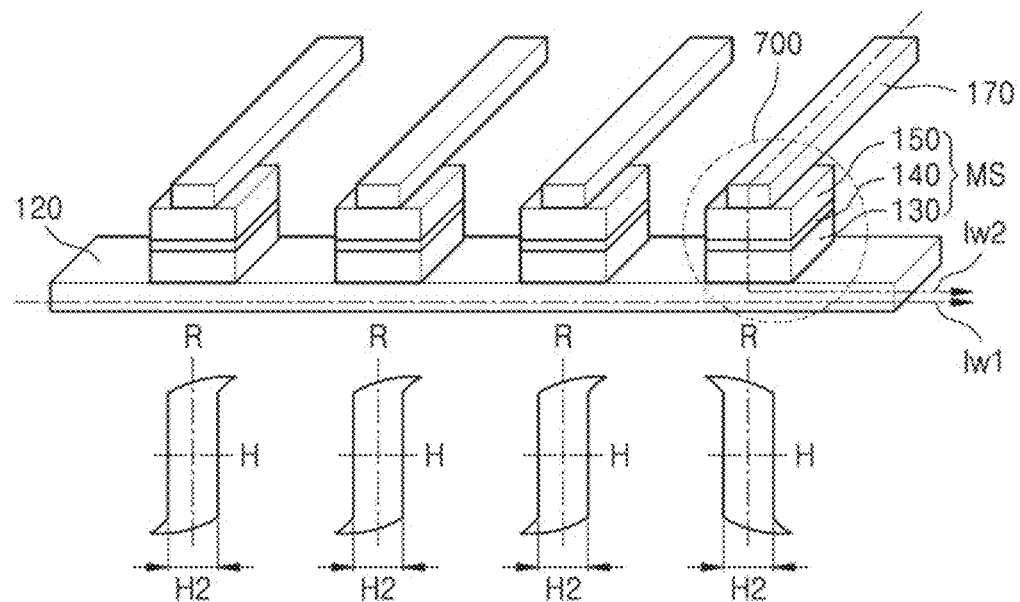

Next, an operating method of the SOT-MRAM according to some example embodiments will be described with reference to FIGS. 5 to 7. Although FIGS. 5 to 7 illustrate only four unit cells for convenience as parts of the array 300 shown in FIG. 3, an operating method to be described with reference to FIGS. 5 to 7 may be equally applied to the entire area of the array 300. The operating method may be a method of recording information. The information may include bit data "1" or "0".

FIG. 5 illustrates a preparation step before information is recorded. In the preparation step, a voltage for information recording is not applied to the data storage layer MS arranged between the first and second wirings 120 and 170.

For convenience, in the description of FIGS. 5 to 7, the first layer 130 of the data storage layer MS is regarded as a free layer and the third layer 150 is regarded as a pinned layer. In addition, the magnetic hysteresis curves illustrated below the first wiring 120 in FIGS. 5 to 7 show the magnetic hysteresis characteristics of the first layer 130 of the data storage layer MS.

Referring to FIG. 5, in the preparation stage, there is no current penetrating the second layer 140 of the data storage layer MS, and there is no current flowing in the first layer 130. Accordingly, the magnetic hysteresis characteristic curve of the first layer 130 of each data storage layer MS may have a first width H1 in a horizontal direction.

In this state, as shown in FIG. 6, a first write current Iw1 is applied to the first wiring 120. The first layer 130 of the data storage layer MS is a 2 dvW material layer and has metal characteristics, and the first write current Iw1 may flow along the first wiring 120 and may flow through the first layer 130 in direct contact with the first wiring 120. However, the first write current Iw1 does not pass through the second layer 140, which is a tunnel barrier layer.

As the first write current Iw1 is applied to the first wiring 120, the first write current Iw1 flows to the first layer 130 and thus a spin current is generated in the first layer 130 according to a spin Hall effect of the first layer 130, and a coercive force of the first layer 130 is less than before the first write current Iw1 flows according to the interaction of the spin current and the magnetic moment of the first layer 130. For example, when the first write current Iw1 is applied, the magnetic hysteresis characteristic curve of the first layer 130 has a second width H2 in the horizontal direction. The second width H2 is smaller than the first width H1 of FIG. 6. Accordingly, the magnetic moment of the first layer 130 is rotated by a specific or predetermined amount in a given direction, and as a result, a plurality of data storage layers MSs of unit cells aligned on the first wiring 120 may be in a half-selected state.

Next, as shown in FIG. 7, a second write current Iw2 is applied to the data storage layer MS of the selected unit cell in which data is to be recorded in a state in which the first write current Iw1 is applied. As a result, the first and second write currents Iw1 and Iw2 may be simultaneously or concurrently applied thereto. For description, in FIG. 7, the rightmost unit cell 700 is selected as the selected unit cell.

The second write current Iw2 applied to the unit cell 700 selected through the second wiring 170 which may be a word line flows to the first wiring 120 through the third layer 150, the second layer 140, and the first layer 130 in turn. In this process, the magnetic moment of the first layer 130 may be switched in the same direction or in the opposite direction to the fixed magnetic moment of the third layer 150, which is the pinned layer, by the spin transfer torque generated in the tunnel junction.

For example, the coercive force of the first layer 130 lowered while the first write current Iw1 is applied may disappear while the second write current Iw2 is applied. This suggests that the magnetic moment of the first layer 130 is switched or completely switched in the same direction or the opposite direction as the fixed magnetic moment of the third layer 150 while the first and second write currents Iw1 and Iw2 are simultaneously applied to the data storage layer MS.

The magnetic hysteresis characteristic curve below the selected unit cell 700 indicates that the magnetic moment of the first layer 130 is completely switched in accordance with the applications of the first and second write currents Iw1 and Iw2.

As described above, in a data recording process for the selected unit cell 700, the spin current generated by the first and second write currents Iw1 and Iw2 is used, and a separate external magnetic field is not used. Accordingly, a problem caused by the use of an external magnetic field of the existing SOT-MRAM may be solved or reduced in likelihood of occurrence and/or in impact from occurrence.

In some examples, the operation of erasing (deleting) the recorded data may be performed opposite to the operation of writing data. For example, in FIG. 7, the erasing operation may be performed by applying an erasing current in a direction opposite to the second write current Iw2 while the first write current Iw1 is maintained. In this erasing operation, an application direction of the first write current Iw1 may be the same as that of FIG. 7 or may be opposite to that of FIG. 7. In the erasing operation, the first write current Iw1 of FIG. 7 may be represented by a first erasing current, and the erasing current applied in a direction opposite to the second write current Iw2 may be represented by a second erasing current. In some examples, a magnitude of the first erasing current may be the same as or different from a magnitude of the first write current Iw1, and a magnitude of the second erasing current may be the same as or different from a magnitude of the second write current Iw2.

Next, an electronic apparatus according to some example embodiments will be described. The electronic apparatus according to an example embodiment may include a magnetic memory device (e.g., SOT-MRAM) according to the example embodiment described above.

Figure 8:
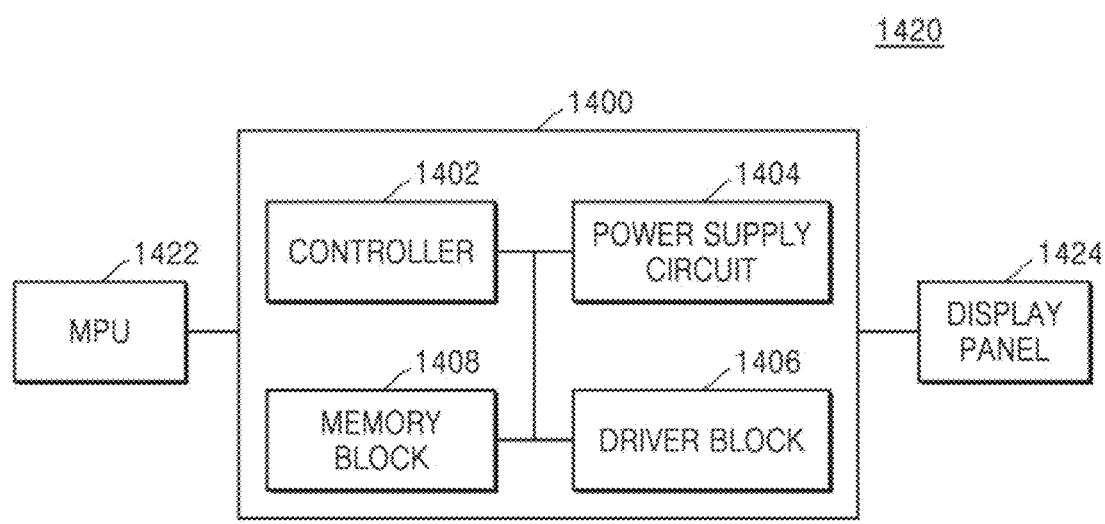
FIG. 8 is a block diagram illustrating a first electronic apparatus according to some example embodiments.

FIG. 8 is a schematic block diagram of a display device 1420 including a display driver IC (DDI) 1400 and a DDI 1400 as a first electronic apparatus according to some example embodiments.

Referring to FIG. 8, the DDI 1400 may include a controller 1402, a power supply circuit 1404, a driver block 1406, and a memory block 1408. The controller 1402 may receive and decode a command applied from the main processing unit (MPU) 1422, and may control each of blocks of the DDI 1400 to implement an operation according to the command. The power supply circuit unit 1404 generates a driving voltage in response to the control of the controller 1402. The driver block 1406 drives the display panel 1424 using the driving voltage generated by the power supply circuit unit 1404 in response to the control of the controller 1402. The display panel 1424 may be a liquid crystal display panel or a plasma display panel. The memory block 1408 may include a volatile memory (e.g., RAM) and/or a nonvolatile memory as a block for temporarily storing a command input to the controller 1402 or control signals output from the controller 1402, or a block for storing necessary data. In some examples, the nonvolatile memory may include a ROM and/or a magnetic memory device according to the above-described example embodiment.

Figure 9:
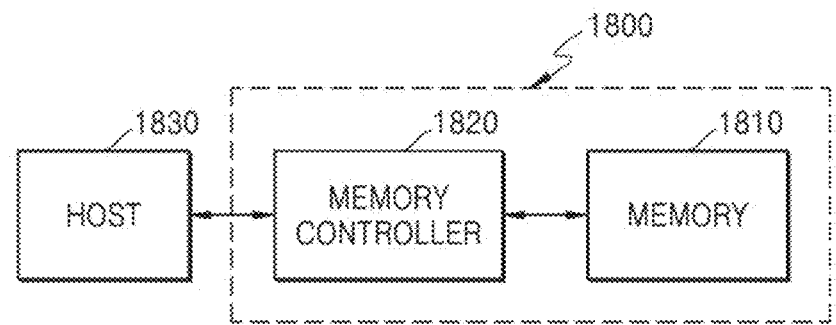
FIG. 9 is a block diagram illustrating a second electronic apparatus according to some example embodiments.

FIG. 9 is a block diagram illustrating an electronic system 1800 as a second electronic apparatus according to an example embodiment.

Referring to FIG. 9, the electronic system 1800 includes a memory 1810 and a memory controller 1820. The memory controller 1820 may control the memory 1810 to read data from the memory 1810 and/or write data to the memory 1810 in response to a request from the host 1830. In some examples, the memory 1810 may include a magnetic memory device according to various example embodiments.

Figure 10:
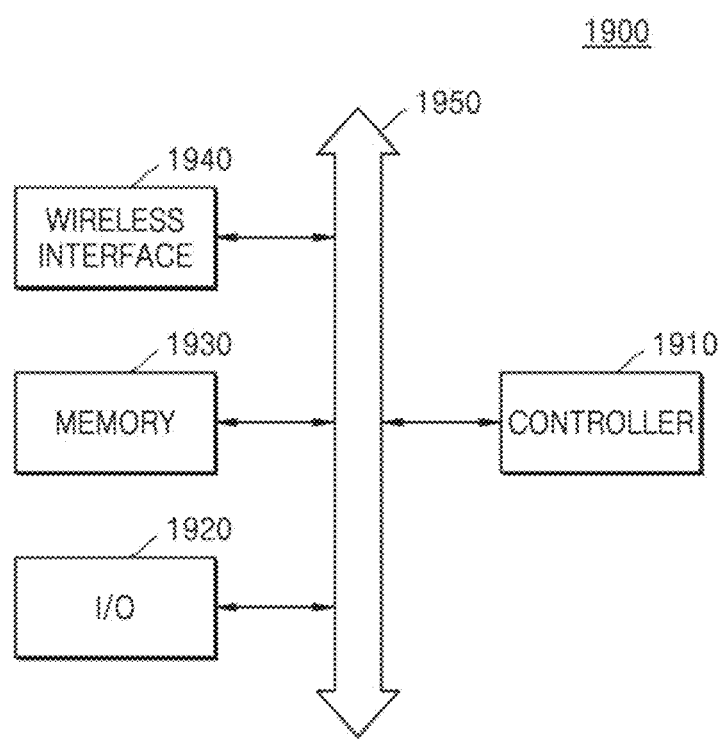
FIG. 10 is a block diagram illustrating a third electronic apparatus according to some example embodiments.

FIG. 10 is a block diagram illustrating an electronic system 1900 as a third electronic apparatus according to some example embodiments.

Referring to FIG. 10, the electronic system 1900 may configure a wireless communication device, or an apparatus capable of transmitting and/or receiving information under a wireless environment. The electronic system 1900 includes a controller 1910, an input/output device (I/O) 1920, a memory 1930, and a wireless interface 1940 which are interconnected through a bus 1950, respectively.

The controller 1910 may include at least one of a microprocessor, a digital signal processor, or a processing device similar thereto. The input/output device 1920 may include at least one of a keypad, a keyboard, and a display.

The memory 1930 may be used to store commands executed by the controller 1910. For example, the memory 1930 may be used to store user data. In some examples, the memory 1930 may include a magnetic memory device according to various example embodiments.

The electronic system 1900 may use the wireless interface 1940 to transmit/receive data through a wireless communication network. The wireless interface 1940 may include an antenna and/or a wireless transceiver. In some example embodiments, the electronic system 1900 may be used in a third generation communication system, e.g., a communication interface protocol of the third generation communication system, such as code division multiple access (CDMA), global system for mobile communications (GSM), north American digital cellular (NADC), extended-time division multiple access (E-TDMA), and/or wideband code division multiple access (WCDMA).

Figure 11:
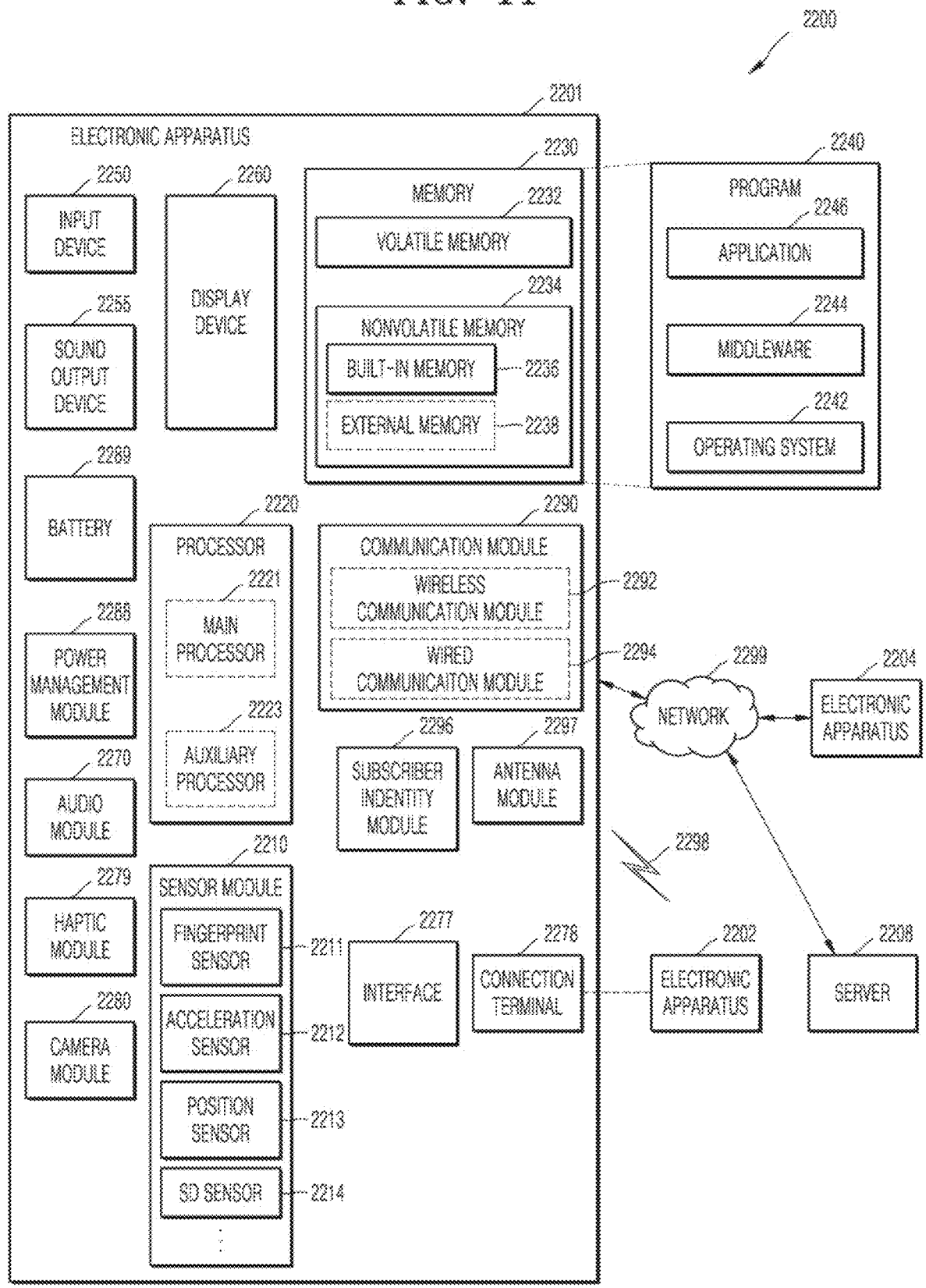
FIG. 11 is a block diagram schematically illustrating a fourth electronic apparatus according to some example embodiments.

FIG. 11 is a block diagram schematically illustrating a fourth electronic apparatus according to some example embodiments.

Referring to FIG. 11, in a network environment 2200, an electronic apparatus 2201 may communicate with another electronic apparatus 2202 through a first network 2298 (a short-range wireless communication network or the like), or with another electronic apparatus 2204 and/or a server 2208 through a second network 229 (a long-range wireless communication network or the like). The electronic apparatus 2201 may communicate with an electronic apparatus 2204 through a server 2208. The electronic apparatus 2201 may include a processor 2220, a memory 2230, an input device 2250, an acoustic output device 2255, a display device 2260, an audio module 2270, a sensor module 2210, an interface 2277, a haptic module 2279, a camera module 2280, a power management module 2288, a battery 2289, a communication module 2290, a subscriber identity module 2296, and/or an antenna module 2297. Some (such as the display device 2260) of these components may be omitted from or other components may be added to the electronic apparatus 2201. Some of these components may be implemented as one integrated circuit. For example, a fingerprint sensor 2211, or an iris sensor, an illuminance sensor, etc., of the sensor module 2210 may be embedded in the display device 2260 (such as a display, etc.).

The processor 2220 may execute software (program 2240 or the like) to control one or a plurality of other components (hardware and software components, or the like) of the electronic apparatus 2201 connected to the processor 2220, and may perform processing or operations of various data. As part of processing or operations of data, the processor 2220 may load commands and/or data received from other components (the sensor module 2210, the communication module 2290, etc.) into the volatile memory 2232, process commands and/or data stored in the volatile memory 2232, and store the resultant data in the nonvolatile memory 2234. The processor 2220 may include a main processor 2221 (a central processing unit, an application processor, etc.), and an auxiliary processor 2223 (graphics processing unit, image signal processor, sensor hub processor, communication processor, etc.) that may be operated independently of or together with the main processor. The auxiliary processor 2223 may use less power than the main processor 2221 and perform a specialized function.

The auxiliary processor 2223 may control functions and/or states related to some (the display device 2260, sensor module 2210, communication module 2290, etc.) of the components of the electronic apparatus 2201, in place of the main processor 2221 while the main processor 2221 is in an inactive state (slip state), or together with the main processor 2221 while the main processor 2221 is in an active state (application execution state). The auxiliary processor 2223 (image signal processor, communication processor, etc.) may be implemented as part of other functionally related components (the camera module 2280, communication module 2290, etc.).

The memory 2230 may store various data required by the components of the electronic apparatus 2201 (the processor 2220, the sensor module 2276, etc.). The data may include, for example, software (program 2240, etc.) and input data and/or output data for the command associated therewith. The memory 2230 may include volatile memory 2232 and/or nonvolatile memory 2234. The nonvolatile memory 2234 may include a built-in memory 2236 and an external memory 2238. In some examples, the nonvolatile memory 2234 may include a magnetic memory device using a spin current according to the above-described example embodiment.

The program 2240 may be stored in the memory 2230 as software, and may include an operating system 2242, middleware 2244, and/or an application 2246.

The input device 2250 may receive commands and/or data to be used in components (processor 2220) of the electronic apparatus 2201 from the outside (user, etc.) of the electronic apparatus 2201. The input device 2250 may include a microphone, a mouse, a keyboard, and/or a digital pen (such as a stylus pen, etc.).

The sound output device 2255 may output the sound signal to the outside of the electronic apparatus 2201. The sound output device 2255 may include a speaker and/or a receiver. Speakers may be used for general purposes such as multimedia playback or recording playback, and receivers may be used to receive incoming calls. The receiver may be coupled as part of a speaker or may be implemented as an independent separate device.

The display device 2260 may visually provide information to the outside of the electronic apparatus 2201. The display device 2260 may include one or more of a display, a hologram device, or a projector and a control circuit for controlling the corresponding devices. The display device 2260 may include a touch circuitry configured to sense a touch, and/or a sensor circuit (a pressure sensor, etc.) configured to measure an intensity of a force generated by the touch.

The audio module 2270 may convert sound into an electrical signal or conversely convert the electrical signal into sound. The audio module 2270 may acquire sound through the input device 2250, or output sound through a communication module, and/or a speaker and/or a headphone of another electronic apparatus (e.g., electronic apparatus 2102) directly or wirelessly connected to the electronic apparatus 2201.

The sensor module 2210 may detect an operating state (power, temperature, etc.) of the electronic apparatus 2201 or an external environmental state (user state, etc.) of the electronic apparatus 2201 and generate an electrical signal and/or a data value corresponding to the sensed state. The sensor module 2210 may include a fingerprint sensor 2211, an acceleration sensor 2212, a position sensor 2213, a 3D image sensor 2214, etc. In addition, the sensor module 2210 may include one or more of an iris sensor, a gyro sensor, an atmospheric pressure sensor, a magnetic sensor, a grip sensor, a proximity sensor, a color sensor, an infrared sensor, a biometric sensor, a temperature sensor, a humidity sensor, and/or an illuminance sensor.

The 3D image sensor 2214 senses the shape and movement of an object by irradiating a predetermined light to the object and analyzing the light reflected from the object, and may include a meta-optical device.

The interface 2277 may support one or more specified protocols that can be used to connect the electronic apparatus 2201 directly or wirelessly with other electronic apparatus (electronic apparatus 2202, etc.). The interface 2277 may include one or more of a high definition multimedia interface (HDMI), a universal serial bus (USB) interface, an SD card interface, and/or an audio interface.

The connection terminal 2278 may include a connector through which the electronic apparatus 2201 can be physically connected to another electronic apparatus (e.g., the electronic apparatus 2102). The connection terminal 2278 may include one or more of an HDMI connector, a USB connector, an SD card connector, and/or an audio connector (such as a headphone connector).

The haptic module 2279 may convert an electrical signal into a mechanical stimulus (vibration, movement, etc.) or electrical stimulus that can be recognized by the user through touch or motor sensation. The haptic module 2279 may include one or more of a motor, a piezoelectric element, and/or an electrical stimulus device.

A camera module 2280 may capture a still image and a moving image. The camera module 2280 may include a lens assembly including one or more lenses, image sensors, image signal processors, and/or flashes. The lens assembly included in the camera module 2280 may collect light emitted from an object to be photographed.

The power management module 2288 may manage power supplied to the electronic apparatus 2201. The power management module 388 may be implemented as part of a power management integrated circuit (PMIC).

The battery 2289 may supply power to components of the electronic apparatus 2201. The battery 2289 may include a non-rechargeable primary battery, a rechargeable secondary battery, and/or a fuel cell.

The communication module 2290 may support establishing a direct (wired) communication channel and/or a wireless communication channel between the electronic apparatus 2201 and another electronic apparatus (electronic apparatus 2102, electronic apparatus 2104, server 2108, etc.), and performing communication through the established communication channel. The communication module 2290 may include one or more communication processors that operate independently of the processor 2220 (such as an application processor) and support direct communication and/or wireless communication. The communication module 2290 may include one or more of a wireless communication module 2292 (a cellular communication module, a short-range wireless communication module, a Global Navigation Satellite System (GNSS) communication module, etc.), and/or a wired communication module 2294 (a local area network (LAN) communication module, power line communication module, etc.). A corresponding communication module of these communication modules may enable one electronic apparatus to communicate with other electronic apparatuses through a first network 2298 (a short-range communication network such as one or more of Bluetooth, Wi-Fi Direct, or infrared data association (IrDA)) or a second network 2299 (a long-range communication network such as a cellular network, Internet, or computer network (such as LAN, WAN, etc.)). These various types of communication modules may be integrated into a single component (such as a single chip), or may be implemented as a plurality of separate components (multiple chips). The wireless communication module 2292 may identify and authenticate the electronic apparatus 2201 in a communication network such as the first network 2298 and/or the second network 2299 using subscriber information (such as an international mobile subscriber identifier (IMSI) etc.) stored in a subscriber identity module 2296.

The antenna module 2297 may transmit a signal and/or power to the outside (such as another electronic apparatus) or receive such a signal and/or power from the outside. The antenna may include a radiator formed of a conductive pattern formed on a substrate (PCB, etc.). The antenna module 2297 may include one or a plurality of antennas. When a plurality of antennas are included in the antenna module 2297, an antenna suitable for a communication scheme used in a communication network such as a first network 2298 and/or a second network 2299 is selected among the plurality of antennas by the communication module 2290. A signal and/or power may be transmitted or received between the communication module 2290 and another electronic apparatus through the selected antenna. Other components (RFIC, etc.) in addition to the antenna may be included as part of the antenna module 2297.

Some of the components are connected to each other and may exchange signals (commands, data, etc.) via a communication scheme (one or more of a bus, General Purpose Input and Output (GPIO), Serial Peripheral Interface (SPI), Mobile Industry Processor Interface (MIPI), etc.) and can interchange signals (commands, data, etc.) between peripherals.

The commands or data may be transmitted and/or received between the electronic apparatus 2201 and the external electronic apparatus 2204 through the server 2108 connected to the second network 2299. The other electronic apparatuses 2202 and 2204 may be the same as or different types of apparatuses from the electronic apparatus 2201. All or some of the operations executed in the electronic apparatus 2201 may be executed in one or more of the other electronic apparatuses 2202 and 2204, and the server 2208. For example, when an electronic apparatus 2201 needs to perform a function or service, instead of executing the function or service itself, the electronic apparatus 2201 may request one or more other electronic apparatus to perform part or all of the function or service. One or more other electronic apparatuses receiving the request may execute an additional function or service related to the request and transmit a result of the execution to the electronic apparatus 2201. To this end, cloud computing, distributed computing, and/or client-server computing technology may be used.

At intersections between the first wiring 120 and the second wiring 170, there may be a data storage layer.

The bit line of the SOT-MRAM is a wiring of a metal material having low electrical resistance equal to or similar to a metal wiring used in a semiconductor device or an electronic apparatus, while having no spin Hall effect or substantially no spin Hall effect. Thus, the operating current density of the SOT-MRAM disclosed may be lower than that of the conventional SOT-MRAM using, as a bit line, a SOT layer (e.g., W, Ta, or Pt) having a relatively high electrical resistance as compared to the metal material. For example, in the case of the disclosed SOT-MRAM, the operating current density may be reduced to 1 MA/cm$^2$ that is about $\frac{1}{100}$ to $\frac{1}{10}$ compared to the operating current density of the conventional SOT-MRAM. Therefore, the number of MTJ cells that can be connected per bit line may be increased compared to the existing SOT-MRAM, which suggests that the degree of integration may be higher than that of the existing SOT-MRAM when the disclosed SOT-MRAM is used.

Alternatively or additionally, the SOT-MRAM is configured to form the free layer of the MTJ cell into a two-dimensional van der Waals material with ferromagnetic properties and metal properties while having a spin Hall effect. Accordingly, when a current flows in the free layer of the MTJ cell, a spin current is generated in the free layer, and thus a magnetic moment of the free layer may be rotated by a predetermined angle in a given direction, thereby lowering a coercive force of the free layer. These results are the same as the operating state of the MTJ cell of the existing SOT-MRAM, which suggests that a combination of the bit line of metal wiring with no spin Hall effect and the two-dimensional van der Waals material layer (free layer) with magnetic and metal properties as the disclosed SOT-MRAM has increased integration and decreased operation current density, while having the operation characteristics (such as the write operation) of the existing SOT-MRAM.

Alternatively or additionally, the operation of the disclosed SOT-MRAM reduces the coercive force of the free layer with a first write current flowing in the free layer without passing through the tunnel barrier layer, and then fully switches the magnetic moment of the free layer with a second write current passing through the pinned layer, the tunnel barrier layer, and the free layer of the MTJ cell in turn. For example, a spin current is generated in the free layer as the second write current passes through the free layer, and the magnetic moment of the free layer is completely switched by interaction between the magnetic moment of the free layer and the generated spin current.

As described above, in the case of the disclosed SOT-MRAM, a spin current is used for the data recording operation, and an external magnetic field applied from the outside of the MTJ cell is not used. Accordingly, when the disclosed SOT-MRAM is used, a problem caused by the use of an external magnetic field in an operation of the existing SOT-MRAM may be solved, or reduced in likelihood of occurrence and/or in impact from occurrence. Alternatively or additionally, since the second write current may be less than the first write current in the data recording operation, it may be seen that the data write path and the data read path are substantially separated in the disclosed SOT-MRAM operation.

Therefore, the disclosed SOT-MRAM may maintain advantages of the existing SOT-MRAM, for example, high-speed switching characteristics of 1 nanosecond or less (<1 nsec) and high endurance.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In certain block diagrams it is to be understood that, unless otherwise stated or clear from context, any component may be connected to any other component, capable of one way communication and/or two-way communication and/or broadcast communication, to exchange information such as but not limited to data and/or commands. The connection may be wireless, and/or may be wired. The information may be exchanged in a serial manner, and/or in a parallel manner. The information may be or may include digital information, and/or may be or may include analog information.

It should be understood that embodiments described herein should be considered in a descriptive sense only and not for purposes of limitation. Descriptions of features or aspects within each various example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:
1. A magnetic memory comprising:
a first wiring;
a second wiring spaced apart from the first wiring and intersecting the first wiring; and
a data storage layer between the first wiring and the second wiring and in contact with the first and second wirings, wherein
the data storage layer comprises:
a pinned layer having a fixed magnetic moment;
a free layer spaced apart from the pinned layer and having a magnetic moment that is switchable by using a spin current as a spin-orbit torque (SOT) layer; and
an insulating tunnel barrier layer between the pinned layer and the free layer, wherein a wiring contacting the free layer from among the first and second wirings includes a conductive wiring that does not have a spin Hall effect, and the free layer comprises a two-dimensional material having a spin Hall effect, magnetic properties, and metallic properties, wherein one of the first wiring and the second wiring is a bit line, and wherein in a cross-point of one of the first wiring and one of the second wiring, the data storage layer is arranged between the cross-point of the first wiring and the second wiring.

2. The magnetic memory of claim 1, wherein the two-dimensional material comprises a two-dimensional van der Waals material.

3. The magnetic memory of claim 2, wherein the two-dimensional van der Waals material comprises at least one of $Fe_{(x)}GeTe_2$ (x is 3 to 5), $CrTe_2$, and $VSe_2$.

4. The magnetic memory of claim 1, wherein
each of the first and second wirings includes a plurality of wirings, and
the data storage layer is provided for each intersecting area of the plurality of first wirings and the plurality of second wirings.

5. The magnetic memory of claim 2, wherein the conductive wiring comprises a Cu wiring.

6. The magnetic memory of claim 1, wherein the tunnel barrier layer comprises one or more of an MgO layer, a boron nitride (BN) layer, or an aluminum oxide layer.

7. The magnetic memory of claim 1, wherein a material of the pinned layer is the same as a material of the free layer.

8. An operating method of a magnetic memory in an operating method of a spin orbit torque-magnetic random access memory (SOT-MRAM), wherein the SOT-MRAM comprises the magnetic memory of claim 1, and the operating method of a magnetic memory comprises:

applying a first operating current to a wiring contacting the free layer among the first and second wirings, a first spin current being generated to the free layer by the first operating current; and applying a second operating current to a wiring not contacting the free layer among the first and second wirings, a second spin current being generated to the free layer by the second operating current.

9. The operating method of claim 8, wherein the second operating current is less than the first operating current.

10. The operating method of claim 8, wherein the first and second operating currents correspond to write currents for data recording.

11. The operating method of claim 8, wherein the first and second operating currents correspond to erasing currents for data erasure.

12. The operating method of claim 8, wherein the two-dimensional material comprises a two-dimensional van der Waals material.

13. An operating method of a spin-orbit torque (SOT)-based magnetic memory including a magnetic tunnel junction (MTJ) including a pinned layer and a free layer, the method comprising performing a first operation,
wherein the performing the first operation comprises:
lowering a coercive force of the free layer of the SOT-based magnetic memory by using a first spin current; and
switching a magnetic moment of the free layer of the SOT-based magnetic memory in which the coercive force is lowered, by using a second spin current.

14. The operating method of claim 13, wherein the first and second spin currents correspond to currents for data recording.

15. The operating method of claim 13, wherein the first and second spin currents correspond to currents for data erasure.

16. The operating method of claim 13, wherein the lowering of a coercive force of the free layer comprises applying a first operating current to a wiring contacting the free layer.

17. The operating method of claim 13,
wherein the switching of a magnetic moment of the free layer comprises applying a second operating current to a wiring contacting the pinned layer.

18. The operating method of claim 13, wherein the free layer comprises a two-dimensional van der Waals material which at room temperature has a spin Hall effect, magnetic properties, and metallic properties.

19. The operating method of claim 16, wherein the wiring contacting the free layer comprises a metal wiring having no spin Hall effect.

20. An electronic apparatus comprising a memory, wherein the memory comprises the magnetic memory of claim 1.

21. The magnetic memory of claim 1, wherein at the cross-point a width of the second wiring along the first direction is less than a width of the data storage layer along the first direction.

* * * * *